United States Patent
Furuichi et al.

(10) Patent No.: US 6,912,363 B2
(45) Date of Patent: Jun. 28, 2005

(54) OPTICAL MODULE WHICH PERMITS STABLE LASER OUTPUT

(75) Inventors: Hiroaki Furuichi, Tokyo (JP); Kazumi Kawamoto, Tokyo (JP); Katsumi Kuroguchi, Tokyo (JP); Atsuhiro Yamamoto, Tokyo (JP); Keiichi Yamada, Tokyo (JP); Tsutomu Okumura, Tokyo (JP); Kazuo Takai, Tokyo (JP); Shohei Hata, Tokyo (JP)

(73) Assignee: OpNext Japan, Inc., Yokohama (JP)

( * ) Notice: Subject to any disclaimer, the term of this patent is extended or adjusted under 35 U.S.C. 154(b) by 175 days.

(21) Appl. No.: 09/919,667

(22) Filed: Jul. 31, 2001

(65) Prior Publication Data

US 2003/0076564 A1 Apr. 24, 2003

(30) Foreign Application Priority Data

Feb. 1, 2001 (JP) .................................. 2001-025014

(51) Int. Cl.[7] .............................................. H04B 10/04
(52) U.S. Cl. ..................... 398/192; 398/196; 398/197; 398/201; 372/32; 372/29.02
(58) Field of Search ................................ 398/182, 192, 398/195–197, 200, 201; 372/32, 29.02

(56) References Cited

U.S. PATENT DOCUMENTS 4,998,256 A * 3/1991 Ohshima et al. ............... 372/32
5,130,998 A * 7/1992 Wakata et al. ................. 372/32

FOREIGN PATENT DOCUMENTS

| JP | 07-302948 | 11/1995 |
| JP | 10-079723 | 3/1998 |
| JP | 2000-012968 | 1/2000 |

OTHER PUBLICATIONS

Yoshimitsu Sakai, et al., "Tunable LD Module with Wavelength Detector Using Etalon," Fujitsu Hokkaido Digital Technology Limited. p. 323.

"Laser Module with Wavelength Locker for WDM System," Fujitsu.51, 3, pp. 148–151 (May, 2000).

Tsuchida et al., "Improvements in the Short–Term Frequency Stability of AlGaAs DH Laser," 2334 Transactions of the I.E.C.E. of Japan, vol. E65, No. 1, Jan. (1982), pp. 65–66.

Mullane et al., "Ultrafast Measurements of an SG–DBR Laser with Picosecond time and Nanoetre Wavelength Resolution using a Fabry–Perot Interferometer," Optoelectronic Research Centre, (1999), pp. 894–895.

Dahmani et al., "Frequency Stabilization of Semiconductor Lasers By Resonant Optical Feedback," Optical Society of America, vol 12, No. 11, Nov.(1987), pp. 876–878.

* cited by examiner

*Primary Examiner*—Leslie Pascal
*Assistant Examiner*—Nathan Curs
(74) *Attorney, Agent, or Firm*—Townsend and Townsend and Crew LLP

(57) ABSTRACT

An optical module for use in detecting a plurality of different wavelengths by making use of the multiple wavelength selectivity of an etalon. The optical module includes a semiconductor laser, a lens for converting a beam emitted from the semiconductor laser into a substantially parallel beam, a beam splitter for splitting the converted beam into a reflected beam and a transmitted beam, and a light-receiving element disposed such that one of the split beams is incident thereupon through an etalon, wherein a center of the reflected beam from the etalon occurring as the beam is incident upon the etalon is arranged to return to a region other than a beam-emitting portion of the semiconductor laser.

20 Claims, 11 Drawing Sheets

OPTICAL MODULE WHICH PERMITS STABLE LASER OUTPUT

BACKGROUND OF THE INVENTION

The present invention relates to an optical module which is applied to a wavelength-division multiplexing optical communication system.

In fiber optic communications, in recent years there has been an increasing demand for a greater transmission capacity. For this reason, a wavelength-division multiplexing optical communication system in which light having different wavelengths is transmitted by one optical fiber to increase the transmission capacity has been put to practical use. The wavelengths used in such a wavelength-division multiplexing optical communication system are limited to bands in the vicinities of the wavelength of 1.3 or 1.55 μm. For this reason, if the intervals between adjacent wavelengths can be made narrower, the number of transmittable wavelengths can be increased. The wavelengths that may be used have been standardized in accordance with the recommendation by International Telecommunication Union (ITU). The spacing of the wavelengths used is tending to become narrower from 200 GHz to 100 GHz and further to 50 GHz, and these frequency spacings, if expressed by the wavelength interval, correspond to 1.6 nm, 0.8 nm, and 0.4 nm. To make the wavelength interval narrower, it is necessary to stabilize each wavelength with high accuracy, and the demand for optical modules for stabilizing the oscillation wavelength of a semiconductor laser has been increasing as a light source therefor.

In an optical module in which the oscillation wavelength of a semiconductor laser is stabilized, a number of methods have been proposed for stabilizing the wavelength by monitoring it. As a method in which a bandpass filter for transmitting a specific wavelength of the laser beam is used, entitled "Wavelength-Variable Laser Light Source Device JP-A-2000-012968 for example, is known. Further, as a method of detecting and stabilizing the wavelength by converting laser light into diffused light by a lens and causing the diffused light to be incident upon an etalon substantially orthogonally thereto, for example, Japanese paper, Sakai et. al. "Tunable LD Module with Wavelength Detector Using Etalon (Proceedings of the 2000 Japan IEICE General Conference (C-3-143))" is known.

SUMMARY OF THE INVENTION

When a bandpass filter for transmitting a specific wavelength from the laser is used, since bandpass filters each having a selective transmittivity of a particular wavelength corresponding to each wavelength to be stabilized need to be prepared for the respective wavelengths, there is a problem in that the number of component parts to be prepared becomes numerous.

In contrast, if the etalon is used, there is an advantage in that the wavelength detection can be effected by a single etalon with respect to a plurality of different wavelengths utilizing repetitive waveform selectivity of etalon. However, when laser light is converted into diffused light, and the diffused light is made incident upon the etalon from a diagonal direction to stabilize the detection of the wavelength, since the diffused light is transmitted through the etalon, the quantity of transmitted light becomes small. Accordingly, the output of the laser light must be increased to obtain a desired quantity of transmitted light.

In addition, when the wavelength is detected and stabilized by converting laser light into a parallel beam by a lens and causing the parallel beam to be incident upon an etalon substantially orthogonally thereto, since it is necessary to cause the parallel beam to be incident upon the etalon at an angle close to a right angle, if the reflected light from the etalon returns to an emitting portion of the semiconductor laser, the oscillation of the laser is likely to become unstable.

In addition, even if the reflected light from the etalon does not return to the emitting portion of the semiconductor laser, if the returned light returns to a rear end face of the laser and is reflected, there is a problem in that multiple reflection and interference occur between the etalon and the rear end face of the laser, thereby rendering the wavelength detection signal unstable.

Accordingly, it is an object of the present invention to provide an optical module which permits stable laser output by reducing the instability of oscillation occurring due to the fact that the reflected light from the etalon returns to the emitting portion of the semiconductor laser and the instability of a wavelength detection signal due to the occurrence of multiple reflection and interference between the etalon and the rear end face of the laser in the method of detecting a plurality of different wavelengths by making use of the multiple wavelength selectivity of the etalon.

In accordance with one aspect of the present invention, there is provided an optical module having the following construction:

(I) The optical module comprising: a semiconductor laser; a lens for converting a beam emitted from the semiconductor laser into a substantially parallel beam; a beam splitter for splitting the converted beam into a reflected beam and a transmitted beam; a first light-receiving element disposed such that one of the split beams is incident thereupon through an etalon; and a second light-receiving element disposed such that another one of the beams is incident thereupon, wherein a center of the reflected beam from the etalon occurring as the beam is incident upon the etalon is arranged to return to a region other than a beam-emitting portion of the semiconductor laser.

In addition to the construction (I) above, in accordance with other aspects of the invention it is possible to adopt one or a plurality of the following arrangements (I-i) to (I-ix):

(I-i) The optical module arranged such that the center of the reflected beam from the etalon is arranged to return to a region other than an end face including the emitting portion of the semiconductor laser.

(I-ii) The optical module arranged such that, in junction-up connection in which the emitting portion of the semiconductor laser is mounted in such a manner as to be remote from a substrate, the lens is mounted so as to be offset in a direction away from the substrate on which the semiconductor laser is mounted, as compared with a state in which a center of the lens and a light-emitting center of the semiconductor laser are aligned.

(I-iii) The optical module arranged such that, in junction-down connection in which the emitting portion of the semiconductor laser is mounted in such a manner as to be close to a substrate, the lens is mounted so as to be offset in a direction of approaching the substrate on which the semiconductor laser is mounted, as compared with a state in which a center of the lens and a light-emitting center of the semiconductor laser are aligned.

(I-iv) The optical module arranged such that an amount of offset of the lens is greater than one half of a total of a radius of a beam waist of the reflected beam from the etalon and a height of the laser emitting portion from the substrate.

(I-v) The optical module arranged such that an amount of offset of the lens is smaller than a quantity of tan 4° of the focal length of the lens.

(I-vi) The optical module arranged such that a beam incident plane of the etalon is inclined with respect to the transmitted beam which is transmitted therethrough.

(I-vii) The optical module arranged such that the beam incident plane of the etalon is inclined in a range of 1 to 5 degrees.

(I-viii) The optical module arranged such that a side elevational shape of the etalon is a parallelogram.

(I-ix) The optical module arranged such that the inclination is formed by changing the thickness of a joining member for joining the etalon and the substrate for mounting the etalon.

In accordance with a further aspect of the present invention, there is provided an optical module having the following construction:

(II) An optical module having construction in which a beam emitted from a semiconductor laser is converted into a substantially parallel beam by a lens, and is subsequently split into a reflected beam and a transmitted beam, one of the beams is incident upon a first light-receiving element, and another one of the beams is incident upon a second light-receiving element through an etalon, wherein the reflected beam which returns to and reflected by the semiconductor laser is split again by a reflected beam and a transmitted beam by the beam splitter, and each of the light-receiving elements is disposed such that a center of each of the beams is not directed upon a center of a light-receiving portion of each of the light-receiving elements.

In accordance with still further aspects of the invention, the above-described construction may be combined with one or both of the following arrangements (II-i) and (I-ii):

(II-i) The optical module arranged such that the reflected beam reflected by the etalon returns to and is reflected by the semiconductor laser.

(II-ii) The optical module arranged such that an angle of the incident beam with respect to a rotating direction of the etalon is set within 3° at maximum from a right angle, and an etalon is provided which has a side elevational shape of a parallelogram and whose light incident plane and emergent plane are inclined within a range of 1 to 5 degrees from a right angle with respect to a substrate on which the etalon is mounted.

DETAILED DESCRIPTION OF THE EMBODIMENTS

Referring now to the accompanying drawings, a description will be given of an embodiment of the invention. First, a description will be given of the configuration and operation of the overall optical module using an etalon.

Figure 2:
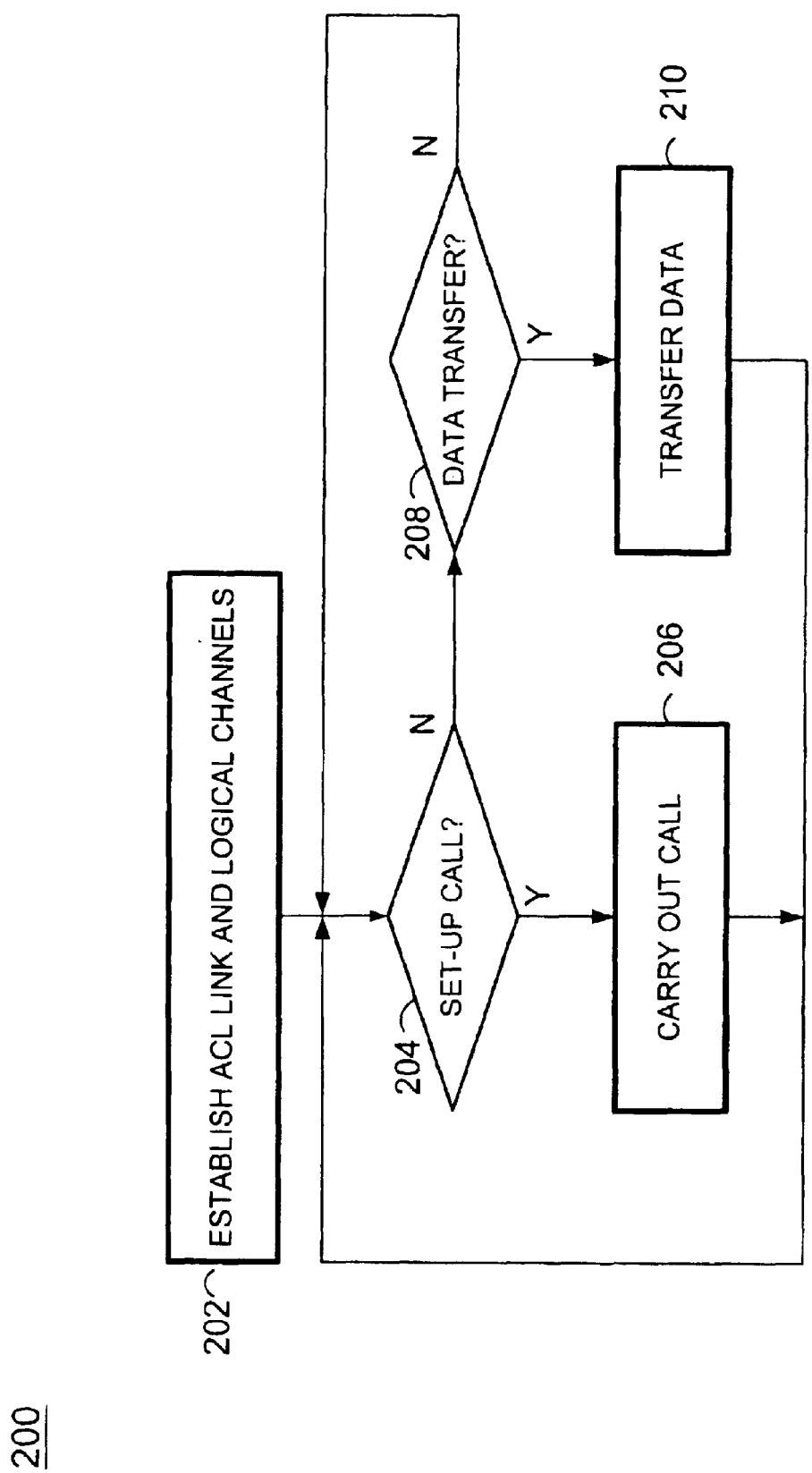
FIG. 2 is a plan view explaining the overall configuration of the first embodiment of the optical module in accordance with the present invention.

FIG. 2 is a plan view illustrating the overall configuration of the optical module. The light emitted forwardly by a semiconductor laser 11 is converted into a forward beam 71 parallel to a beam center axis 23 by a front lens 17, and after being transmitted through an unillustrated isolator, the forward beam 71 is focused by a front lens 18 and is made incident upon a fiber at the center of an end face of an optical fiber ferrule 19 so as to be used for communication. To stabilize the quantity and wavelength of this light, a wavelength-monitoring optical system is added in the rear of the semiconductor laser 11.

In the Figures that follow, the illustration of the front optical system (the arrangement located on the optical fiber ferrule 19 side with respect to the semiconductor laser 11 (the front lenses 17 and 18, the optical fiber ferrule 19, and the like)) is omitted. As for the wavelength monitoring optical system, component parts are positioned on a substrate 10, and are mounted thereon by soldering, bonding, or the like. The laser light emitted backwardly from the semiconductor laser 11 is converted into a backward beam 20 parallel to the beam center axis 23 by a rear lens 12, and is split into a beam-splitter reflected beam 21 and a beam-splitter transmitted beam 22 by a planar beam splitter 13 having a half mirror on one side thereof. The beam-splitter reflected beam 21 is made incident upon a PD1 light-receiving element 16 for detecting the quantity of laser light. Meanwhile, the beam-splitter transmitted beam 22, after being transmitted through an etalon 14, is made incident upon a PD2 light-receiving element 15 for detecting the variation of the wavelength.

Figure 4:
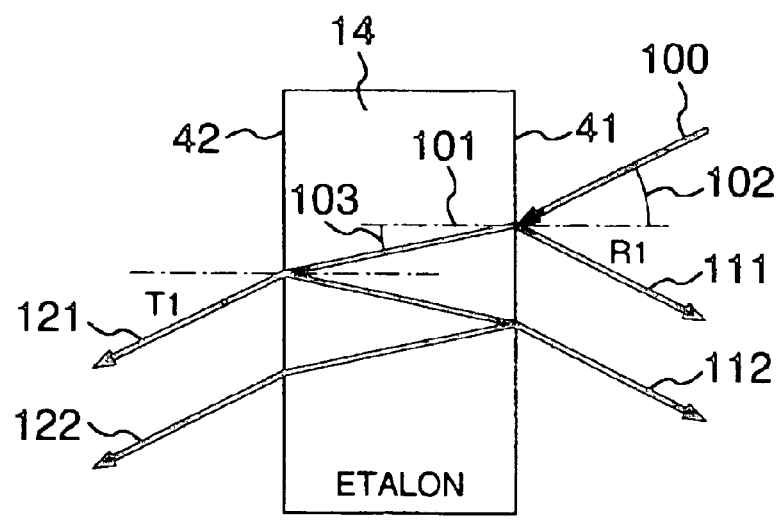
FIG. 4 is a cross-sectional view explaining a state of the light in the etalon.

As shown in FIG. 4, the etalon is a parallel flat plate having high degrees of parallelism and flatness and formed of optical glass, quartz, or the like, semitransparent films 41 and 42 being respectively provided on both surfaces of the parallel flat plate. In accordance with the ratio between reflection and transmission which is determined by the film reflectivity r of the semitransparent film 41, an incident beam 100 is split into an R1 reflected beam 111 and light which is transmitted through the interior of the etalon 14, and the light transmitted therethrough is further split by the semitransparent film 42 into reflected light and a T1 transmitted beam 121 emitted to outside the etalon 14. Here, if a beam incidence angle 102 with respect to an orthogonal axis 101 of incidence on the etalon and the refraction index of the etalon are determined, a beam refraction angle 103 can be determined uniquely in accordance with Snell's law. Thereafter, the reflection and the transmission are repeated at both end faces of the etalon as the R1 reflected beam 111, the T1 transmitted beam, an R2 reflected beam 112, a T2 transmitted beam 122, . . . Numerous wavefronts thus generated interfere with each other to form a Fabry-Perot type interferometer which is used as a wavelength selection/transmission type filter.

Figure 5:
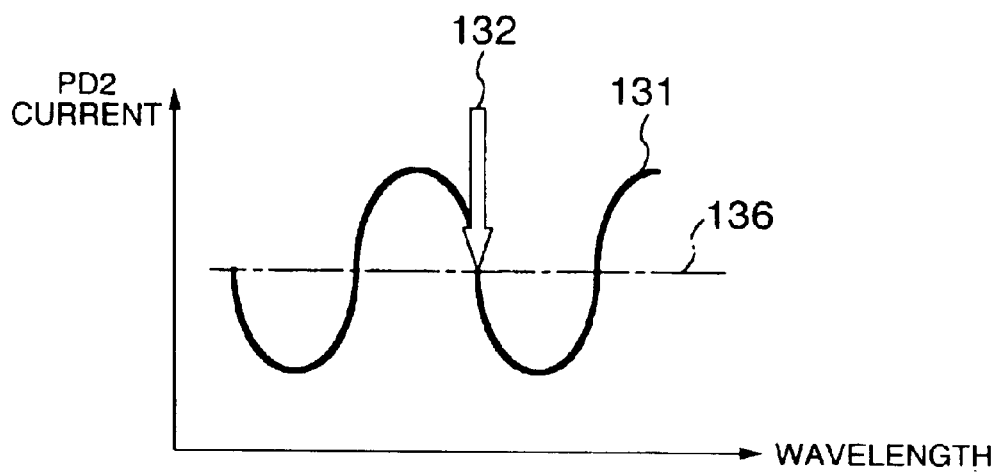
FIG. 5 is a diagram explaining the relationship between the wavelength and a PD2 current.
Figure 6:
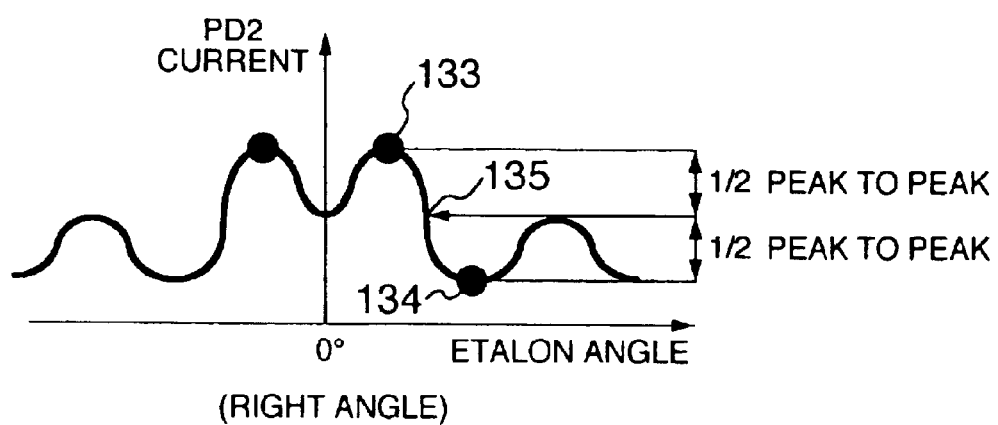
FIG. 6 is a diagram explaining the relationship between the etalon angle and the PD2 current.

The quantity of light transmitted through the etalon is detected by the PD2 light-receiving element 15, and forms a PD2 current curve 131 having repeated peaks at fixed wavelength intervals with respect to the variation of its wavelength, as shown in FIG. 5. For this reason, it becomes possible to monitor the wavelength variation in the vicinity of the wavelength which is desired to be stabilized, for example, at a wavelength locking point 132. FIG. 6 shows the relationship between, on the one hand, the angle of the plane of incidence of the etalon with respect to an incident beam, specifically the amount of variation of the etalon angle starting with a right angle and, on the other hand, the PD2 current. If the etalon angle in the vicinity of the right angle is varied with respect to the light beam, it is always possible to detect a first peak current 133 and a first bottom current 134. The etalon 14 is fixed at an etalon fixing angle 135 which corresponds to a current intermediate between these two currents. If the wavelength is varied in this state, the relationship between the wavelength and the PD2 current becomes such as the one shown in FIG. 5. If control is provided such that a wavelength-locked PD current 136 corresponding substantially to the center of the PD2 current curve 131 becomes constant at the wavelength locking point 132, the wavelength is stabilized at a fixed level. Here, the etalon angle at the actual wavelength locking point 135 is 0.8 to 2.6 degrees or thereabouts in the case of the etalon with a 100 GHz spacing and 0.6 to 1.8 degrees or thereabouts in the case of the etalon with a 50 GHz spacing. In the actual module shown in FIG. 2, the arrangement provided is such that the etalon 14 is rotated within the above-described angular range from the right angle in the θy direction with respect to the beam-splitter transmitted beam 22 so as to effect adjusting at the etalon fixing angle 135, thereby conforming the wavelength to a aforementioned specific wavelength determined by ITU.

Figure 3:
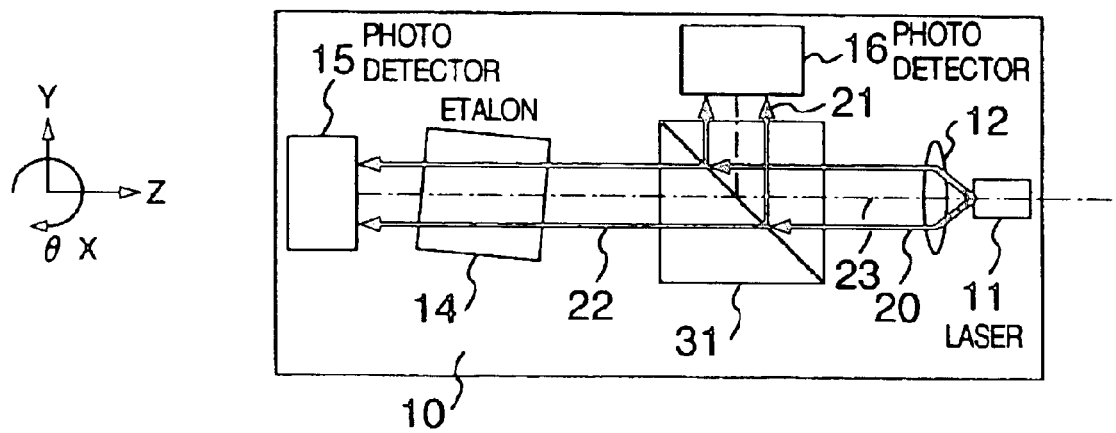
FIG. 3 is a plan view explaining a case in which another beam splitter is used in accordance with the present invention.

FIG. 3 illustrates another method of branching the backward beam 20 in which the backward beam 20 is branched by using a cube-type beam splitter 31 formed by joining two rectangular equilateral triangle-shaped prisms at their half mirror surfaces. In addition, although not illustrated, an arrangement may be provided for controlling the wavelength by transmitting the entire portion or a portion of the backward beam through the etalon without using the beam splitter.

Here, a description will be given of the return light from the etalon 14, which is common to the above-described two wavelength monitoring methods, to the semiconductor laser 11. In either case, the angle of incidence upon the etalon 14 with respect to the backward-beam center axis 23 is within approximately 3 degrees, as described above, in the θy direction for effecting the centering adjustment by rotating the etalon 14, and is in a state substantially close to a right angle. For this reason, there is a possibility that the light which is not transmitted through the etalon is reflected, and is converged again by the rear lens 12, and that the reflected light from the etalon returns to the emitting portion of the semiconductor laser, thereby possibly rendering the oscillation of the laser unstable. In addition, even when the reflected light from the etalon does not return to the emitting portion of the laser, if the reflected light from the etalon returns to the rear end face of the laser and is reflected, there is a possibility that multiple reflection occurs between the etalon and the rear end face of the laser, and that the detection signal light and its reflected waves interfere with each other, with the result that the wavelength detection signal may become unstable.

A method for overcoming these problems will be described below.

Figure 1:
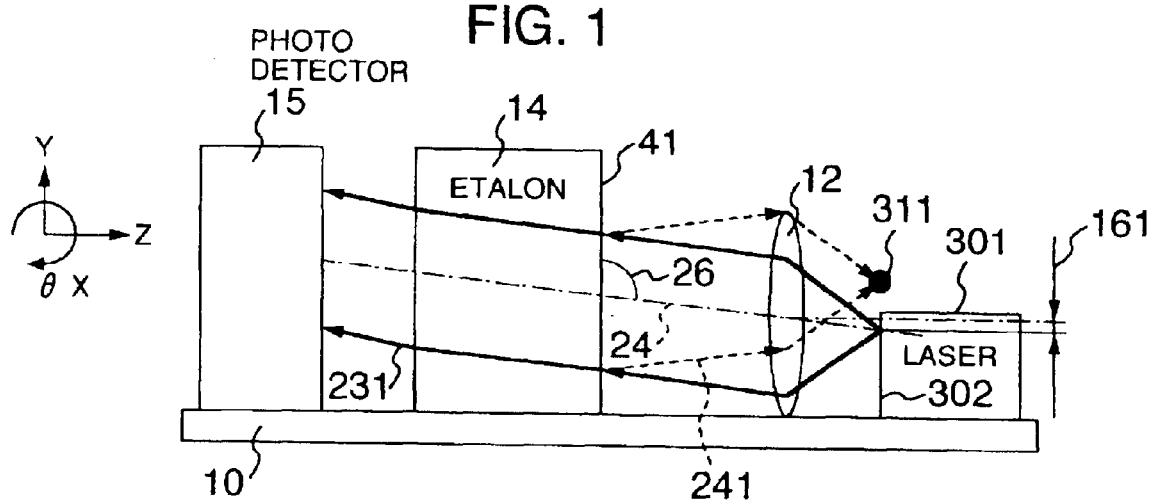
FIG. 1 is a side elevational view illustrating a first embodiment of an optical module in accordance with the present invention, which explains the reflected light of a light beam from an etalon when a lens is shifted upward.

FIG. 1 is a cross-sectional view (side elevational view) illustrating the reflected light of the light beam from the etalon 14 in a case where the central position of the rear lens 12 is offset in the Y+ direction, i.e., in the upward direction, with respect to the emitting portion of a semiconductor laser 301. For the sake of simplification of the description, the beam splitter 13 which is not directly related to the reflection from the etalon 14 is omitted in the Figures. In the Figures that follow thereafter, the beam splitter 13 is omitted, as required, if it is unrelated. Further, FIG. 1 shows a case where the semiconductor laser 301 is in state of junction-up connection in which its active layer, i.e., the emitting portion of the semiconductor laser 301, is located on the upper side and is remote from the soldered joint surface.

As illustrated, if the height of the center of the lens 12 is set to be higher by a lens upper Y-shift 161 with respect to the height of the active layer, i.e., the emitting portion of the semiconductor laser 301, a beam incidence angle 26 of a backward beam center 24 with respect to the etalon 14 becomes large from a right angle in the θx direction. For this reason, it becomes possible to provide an arrangement such that, although the transmission loss of an etalon transmitted beam 231 becomes slightly large, an etalon reflected beam 241 reflected mainly from the semitransparent film 41 of the etalon 14 is focused on an etalon-reflected beam position 311 above the semiconductor laser 301, and does not return to a rear end face 302 of the semiconductor laser 301. Hence, problems such as the return light to the semiconductor laser 301, multiple reflection, and interference do not occur. Furthermore, if a reflection preventing film is formed in advance on the rear end face 302, it is possible to further reduce the reflection caused by a cleavage plane. In addition, if reflection preventing films are formed in advance on regions other than the semiconductor laser (a casing for covering the components including the substrate 10, and the like), it becomes possible to reduce unwanted multiple reflections. It should be noted that as this reflection preventing film, one having a lower reflectivity than that of the cleavage plane of the semiconductor laser 301 is used.

Next, a description will be given below of the allowable range of the lens upper Y-shift 161.

Figure 7:
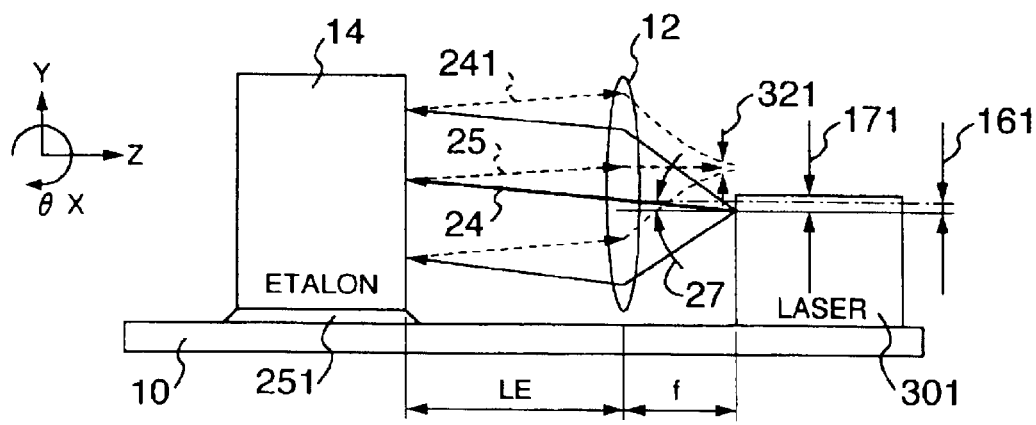
FIG. 7 is a side elevational view explaining a case in which the lens is shifted upward by a minimum amount.

FIG. 7 shows the concept of calculation of an allowable minimum value of the lens upper Y-shift 161, wherein a state is emphasized in which the etalon reflected beam 241 from the etalon 14 is focused on and passes a position higher than the semiconductor laser 301 but extremely close thereto. It should be noted that the portion of the beam which is unrelated to the reflection from the etalon and passed through the etalon is omitted in the Figure. This portion is also omitted, as required, in the Figures that follow.

In FIG. 7, the center of the beam emitted from the semiconductor laser 301 passes the center of the lens 12 which is offset upwardly by the lens upper Y-shift 161, and becomes the backward beam center 24. The beam reflected by the obverse surface of the etalon 14 is reflected as an etalon-reflected beam center 25, is focused again by the rear lens 12, and reaches a reflected return-light beam waist 321.

Figure 8:
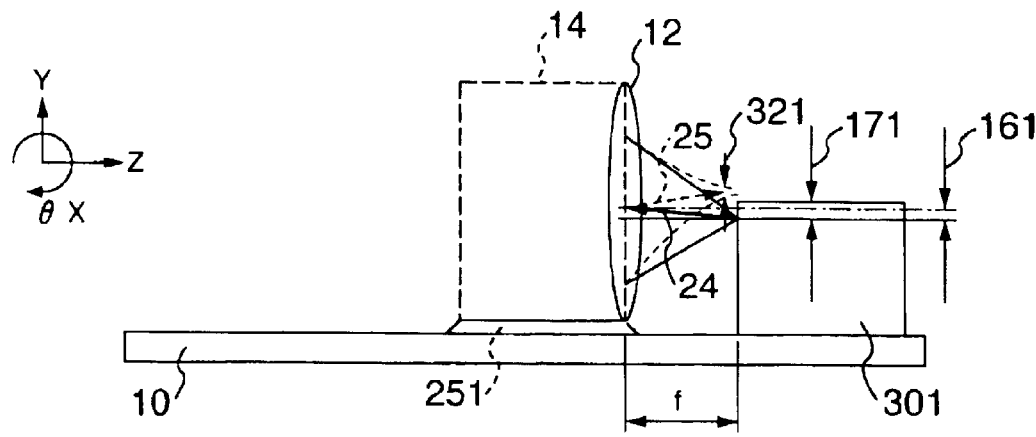
FIG. 8 is a side elevational view explaining a case in which the lens is shifted upward by a minimum amount.

Here, a condition for preventing this beam waist from being applied to the semiconductor laser 301 is determined. If it is assumed that the distance between the rear lens 12 and the obverse surface of the etalon 14 is LE, the greater LE, i.e., the remoter the etalon 14, the higher the height of the reflected return-light beam waist 321 in the Y+ direction. If the condition is determined by assuming the case of LE=0 in which the obverse surface coincides with the center of the rear lens 12 as shown in FIG. 8, the case of LE>0 in which the etalon is actually spaced apart is also satisfied. Namely, if it is assumed that the reflection takes place at the position of the rear lens 12, that condition can be set as an allowable minimum value.

Incidentally, if the rear lens 12 is offset upwardly as in the illustrated case, the reflected light is focused by being offset in the offset upward direction. In addition, the amount of offset of that focused reflected light is determined by an angular deviation 27 of the lens center, that is, twice the amount of offset of the rear lens 12. Accordingly, to prevent the beam waist from being applied to the position above the semiconductor laser 301, it suffices if not less than a half of the total of the radius of the reflected return-light beam waist 321 and the height 171 of the emitting portion of the laser (height from the upper surface of the semiconductor laser 301 to the active layer) is set as the lens upper Y-shift 161. That is, the following condition can be met without depending on the focal length f of the rear lens 12.

(lens upper Y-shift 161)>((radius of the reflected return-light beam waist 321)+(height 171 of the emitting portion of the laser))/2

The normal radius of the beam waist is often defined by the radius of the optical power distribution in which the light intensity of the beam becomes $1/e^2$ which is maximum, but optical power of 10% or more is present in a region outside this radius. There is a possibility that even the return light with the optical power of several percent or less can produce effects. Accordingly, to further improve the reliability, a beam having a radius larger than the normal radius of the beam waist should preferably not be applied to the semiconductor laser 301. Further, according to a normal assembling method, a positional offset of ±10 μm or thereabouts can occur in the Z direction, i.e., in the direction of the optical axis, during the assembly and joining of the rear lens 12, and the radius of the reflected return light becomes larger than the beam waist. By taking these factors into consideration, even a beam having a radius in which the optical power in a region outside the normal radius of the beam waist is 1% or less and having a radius larger than the normal radius of the beam waist due to the positional offset in the Z direction should preferably not be applied to the semiconductor laser 301. Additionally, even a beam having a radius approximately twice the normal radius of the beam waist should preferably not be applied to the semiconductor laser 301.

Namely, the minimum condition of the lens upper Y-shift 161 should preferably satisfy the following condition for practical purposes:

(lens upper Y-shift 161)>((radius of the reflected return-light beam waist 321)+(height 171 of the emitting portion of the laser))/2

Figure 9:
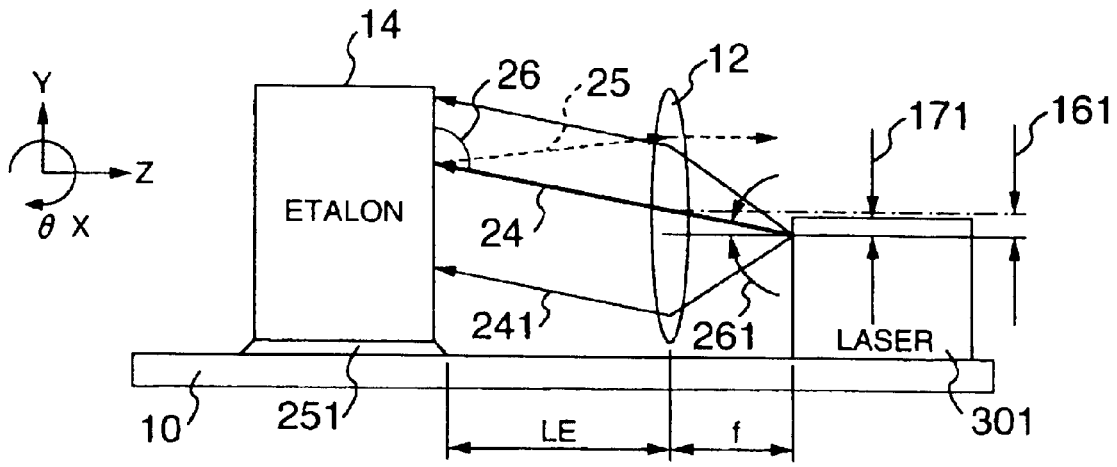
FIG. 9 is a side elevational view explaining a case in which the lens is shifted upward by a maximum amount.

Next, FIG. 9 shows the concept of calculation of an allowable maximum value of the lens upper Y-shift 161, wherein a state is emphasized in which the etalon reflected beam 241 from the etalon 14 passes above the semiconductor laser 301 with a maximum height.

If the lens 12 is offset upwardly by the lens upper Y-shift 161 as described above, the beam reflected by the obverse surface of the etalon 14 is reflected as the etalon-reflected beam center 25, and is focused again by the rear lens 12.

However, if the beam incidence angle 26 of the backward beam center 24 with respect to the etalon 14 is excessively offset from the right angle, the transmission loss of the etalon increases, and a problem such as a decline in its wavelength selection characteristic occurs. Accordingly, it is necessary to suppress the beam incidence angle 26 with respect to the etalon 14 within a fixed angular range from the right angle.

Figure 11:
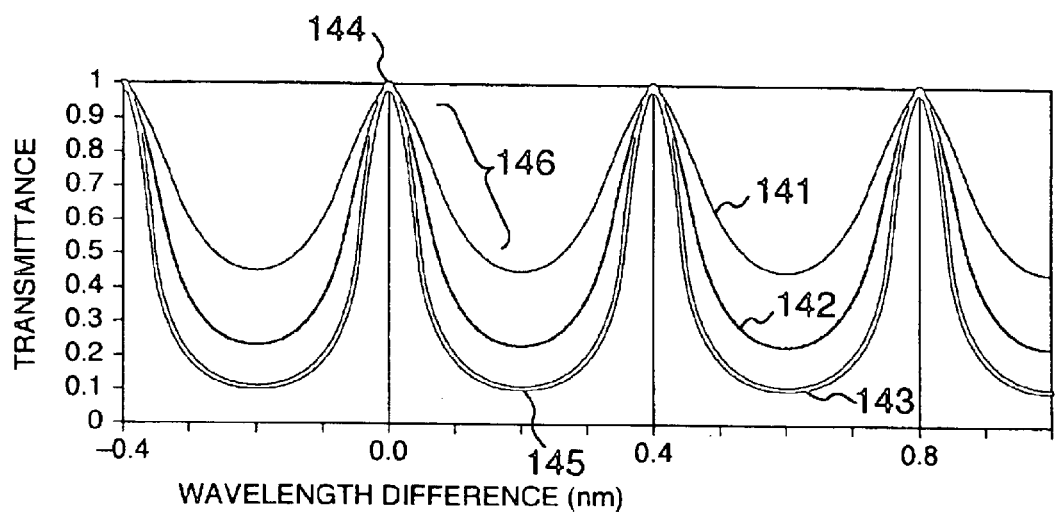
FIG. 11 is a diagram explaining the relationship between the wavelength and the transmittance of the etalon.

Here, a limit of the beam incidence angle 26 is determined on the basis of the transmission loss of the etalon 14. Here, a description will be given of the etalon with a 50 GHz spacing at which the transmission loss is larger than 200 GHz and 100 GHz spacings. FIG. 11 shows the relationship between the wavelength of the etalon and the transmittance. This diagram shows calculated values obtained under a condition in which the film reflectivity of the etalon was varied to 20%, 35%, and 50% when an ideal parallel beam was incident upon the etalon at a right angle. The etalon with the 50 GHz spacing has repeated peaks at 0.4 nm intervals, and the greater the film reflectivity, the smaller the bottom which is a minimum value of transmittance. As for the control of the wavelength, a feedback method is assumed in which the transmittance becomes fixed, i.e., the quantity of light transmitted through the etalon becomes fixed, at the center or its vicinity of a straight portion 146 between a peak 144 and a bottom 145. The wider the range of the wavelength of this straight portion 146, the wider the control range of the wavelength. In other words, the case of low film reflectivity in which the form of the graph becomes close to a chopping wave is desirable. In an actual optical system, light components which are not parallel light are included due to the lens aberrations, and there occur such as the fabrication error in the parallelism of the etalon, the offset of the angle of incidence of the beam upon the etalon from the right angle, and the positional offset in the direction of the optical axis at the time of the assembly of the lens. For this reason, the transmittance of the peak becomes smaller than 1, and the transmittance of the bottom becomes larger than a calculated value. If this fact that the interval between the peak and the bottom becomes narrow is taken into consideration, there are many cases where 30 to 40% or thereabouts is actually suitable as the film reflectivity of the etalon.

Figure 12:
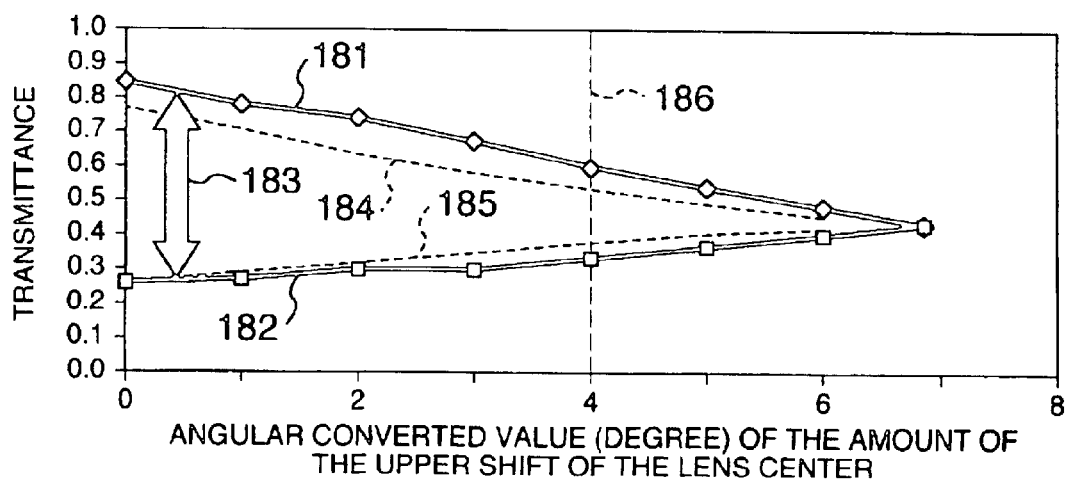
FIG. 12 is a diagram explaining the relationship between an angular converted value of the amount of the upper shift of the lens center and the transmittance.

Accordingly, FIG. 12 shows the results of actual measurement of the relationship between the angular converted value of the amount of the upper shift of the lens center and the transmittance when an etalon with a 50 GHz spacing and a film reflectivity of 35% was used. The abscissa shows the angular converted value of the amount of the upper shift of the lens center, and this is an angle formed by the lens upper Y-shift 161 and the focal length f of the rear lens 12 in FIG. 9 (the focal length f being generally set so as to be the distance between the semiconductor laser 301 and the center of the lens 12) and corresponds to an angular deviation 261 of the lens center with respect to the emitting portion of the semiconductor laser 301. This angular deviation 261 is an angle in which 90 degrees is subtracted from the beam incidence angle 26 with respect to the etalon 14 when the incident plane of the etalon 14 is perpendicular to the substrate 10. After the lens position in the direction of the optical axis was optimized, and the beam was converted into a substantially parallel beam, the peak and the bottom shown in FIG. 11 were determined by subsequently varying the wavelength for each lens upper Y-shift 161, and are plotted as a peak 181 of the parallel beam and a bottom 182 of the parallel beam. Here, if the difference 183 of transmittance between the peak and the bottom is excessively small, i.e., if the inclination of the straight portion between the peak and the bottom is excessively small, the accuracy for controlling the wavelength declines. For this reason, it is preferred that the difference 183 of transmittance between the peak and the bottom be normally not less than 0.1 or thereabouts.

In addition, when the actual assembly of the lens is effected by soldering or welding, the positional offset in the direction of the optical axis occurs within ±10 μm or thereabouts. Due to this defocusing, the peak 181 of the parallel beam drops as indicated by a peak 184 during defocusing, and the bottom 182 of the parallel beam rises as indicated by a bottom 185 during defocusing.

As can be appreciated from the Figure, in order for the difference of transmittance between the peak and the bottom to be not less than 0.1, since the angular converted value of the amount of the upper shift of the lens center is up to about 5 degrees, it is necessary to suppress this value below that level. Namely, it is necessary to satisfy the following condition in correspondence with the focal length f of the lens 12.

(lens upper Y-shift 161)<(lens focal length f)×(tan 5°)

Figure 10:
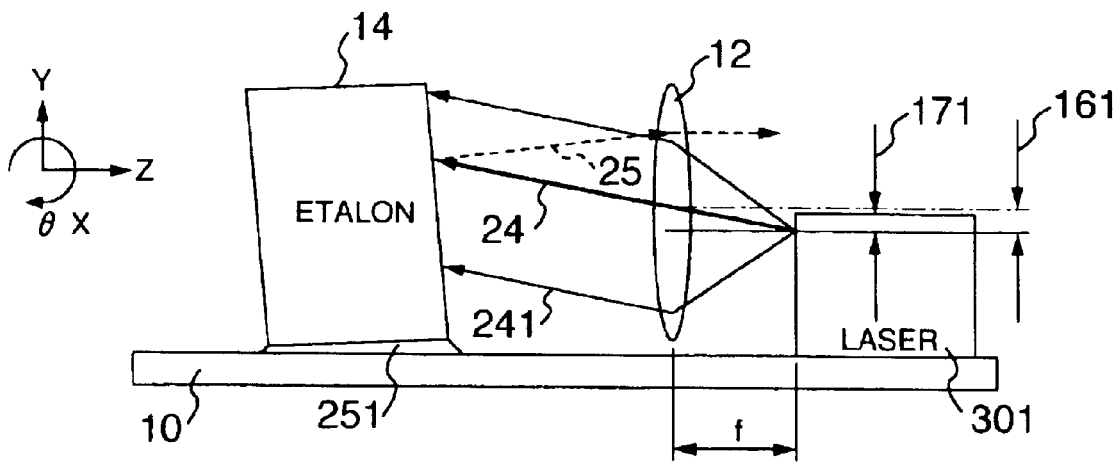
FIG. 10 is a side elevational view explaining a case in which an inclination has occurred in the etalon in FIG. 9.

In practice, however, as shown in FIG. 10, the processing accuracy of the perpendicularity of the beam incident plane with respect to the bottom surface of the etalon 14 deviates from a right angle. Further, the thickness of an etalon joining material 251 for joining the etalon 14 and the substrate 10 also varies. This deviation and the variation, if converted to an inclination, normally correspond to 0.5 to 1 degree or thereabouts. For this reason, the aforementioned condition is unsatisfactory if the incident plane of the etalon 14 is inclined in the minus direction of θx. On the other hand, if the lens upper Y-shift 161 is made large, the angular field of view of the rear lens 12 is exceeded, and lens aberrations and the optical power of the lens become large, so that it is undesirable. For this reason, for practical purposes it is preferable to suppress the angle of the incident plane of the etalon with respect to the incident beam within an angular deviation limit 186 (FIG. 12) which is within 4 degrees from the right angle by subtracting 1 degree from the aforementioned limit of about 5 degrees. Accordingly, it suffices if the maximum condition for the lens upper Y-shift 161 satisfies the following for practical purposes:

(lens upper Y-shift 161)<(lens focal length f)×(tan 4°)

From the above, it is possible to determine the allowable range of the lens upper Y-shift 161 which can be used for practical purposes.

It should be noted that a similar effect can be also attained by a method in which the incident plane of the etalon is disposed in an inclined manner with respect to the angle of incidence of the light beam, and the reflected beam from the etalon is allowed to pass a position above the semiconductor laser.

Figure 13:
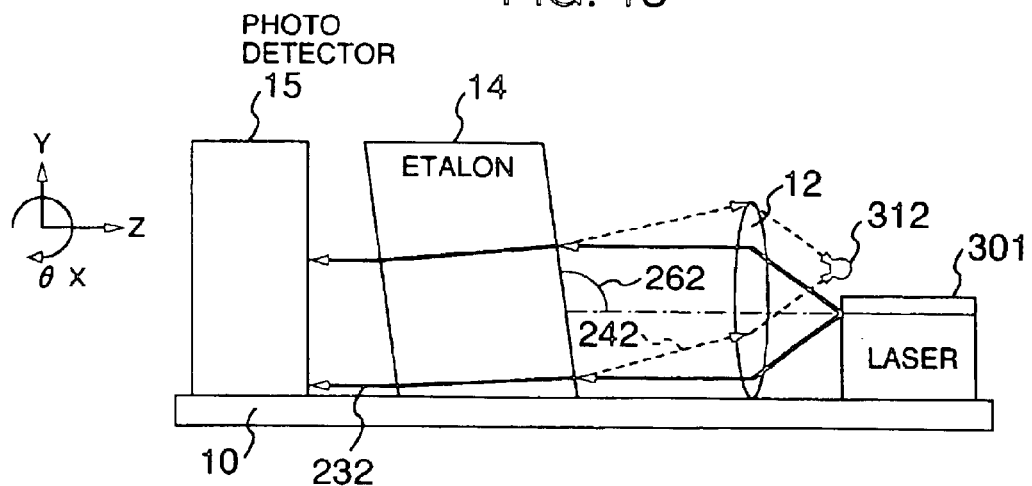
FIG. 13 is a side elevational view illustrating the reflected light of the light beam from the etalon when the side elevational shape of the etalon is formed as a parallelogram.

FIG. 13 is a side elevational view illustrating the reflected light of the light beam from the etalon 14 when the etalon 14 is inclined with respect to the light beam. When the height of the lens center is set to be identical to the height of the active layer of the semiconductor laser and is intentionally not shifted, the etalon 14 is disposed diagonally with respect to the angle of incidence of the light beam so as to offset the angle of incidence of the light beam from the right angle in the θx direction, thereby allowing the reflected return light to be focused on a position above the semiconductor laser 301.

Figure 19:
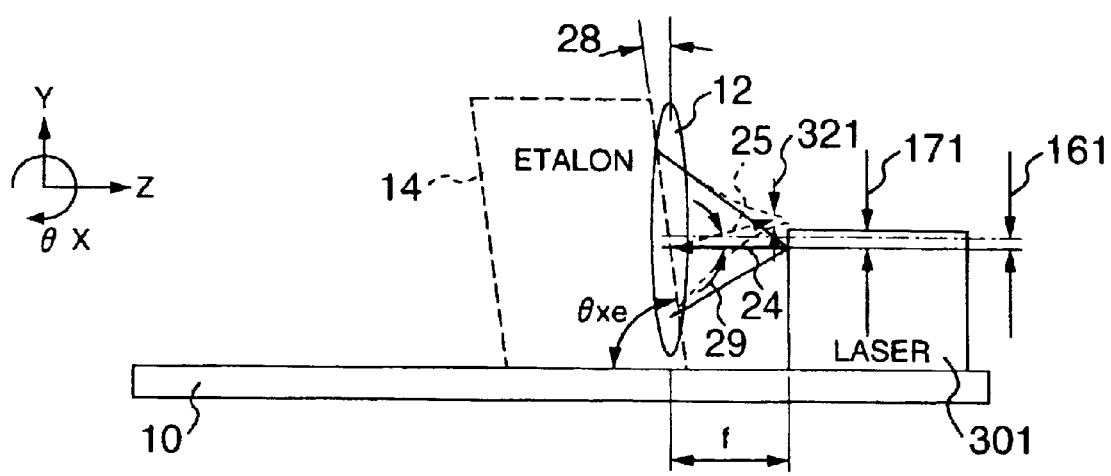
FIG. 19 is a side elevational view explaining a case in which the incident plane of the etalon is inclined by a minimum amount.

Here, a minimum value of this angular deviation is determined. As the most stringent condition, if the condition is determined by assuming the case of the distance LE between the rear lens 12 and the obverse surface of the etalon 14 is 0 as shown in FIG. 19, its value becomes an allowable minimum value, and the case of LE>0 in which the etalon is actually spaced apart can be also satisfied. In this case of LE=0, since the etalon-reflected beam center is reflected at an angle 29 which is twice an angular deviation 28 of the etalon from the right angle, it suffices if the following condition is met:

(lens focal length f)×(tan (2×angular deviation 28 of the etalon))>((radius of the reflected return-light beam waist 321)+ (height 171 of the emitting portion of the laser))

Further, if it is assumed that the radius of the reflected return-light beam waist 321 is also in a range twice the normal range in the same way as described above, it suffices if the following condition is met:

(lens focal length f)×(tan (2× angular deviation 28 of the etalon))>(2×(radius of the reflected return-light beam waist 321)+ (height 171 of the emitting portion of the laser))

Here, the angular deviation 28 of the etalon is specifically determined by using typical values.

A micro lens used as the rear lens 12, normally has a numerical aperture of 0.4 or thereabout, and if it is assumed in the light of its manufacture and handling that its outer diameter is 500 μm or more and that its focal length is 300 μm or more, the radius of the reflected return-light beam waist 321 can be determined to be 2 to 3 μm or thereabout which is a limit of diffraction. Further, if the conditions are assumed to be the focal length f of the lens=300 μm, the radius of the reflected return-light beam waist 321==3 μm, and the height 171 of the emitting portion of the laser=5 μm, then the angular deviation 28 of the etalon is larger than approx. 1.0 degree. Namely, the minimum value of the angular deviation becomes approximately 1 degree or thereabout.

Figure 14:
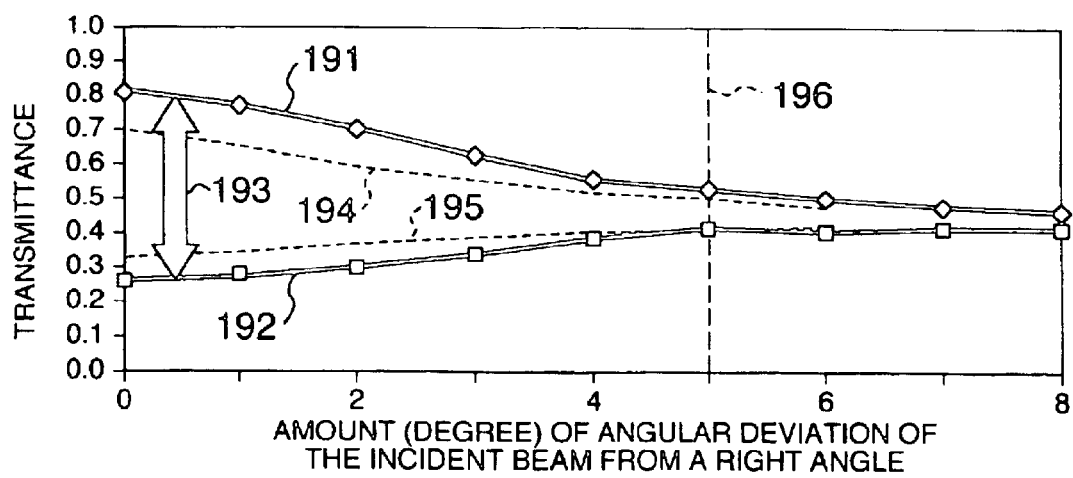
FIG. 14 is a diagram explaining the relationship between the amount of angular deviation of the incident beam from a right angle and the transmittance.

Meanwhile, the maximum value of the angular deviation can be determined from the transmission loss of the etalon substantially in the same way as the above-described case in which the lens center is shifted. FIG. 14 shows the results of actual measurement of the relationship between the amount of angular deviation of the incident beam from the right angle and the transmittance when an etalon with a 50 GHz spacing and a film reflectivity of 35% was used in the same way as described above. After the lens position in the direction of the optical axis was optimized, and the beam was converted into a substantially parallel beam, the peak and the bottom shown in FIG. 11 were determined by subsequently varying the wavelength for each angle of the incident plane of the etalon 14, and are plotted as a peak 191 of the parallel beam and a bottom 192 of the parallel beam. When the lens is shifted, if the angle is made large, the difference 183 of transmittance between the peak and the bottom practically disappears (see FIG. 12) due to the aberrations of the lens, whereas when the angle of incidence of the etalon is inclined, the effect of aberrations due to the shifting of the lens is small, and even if the angle is large, a difference 193 of transmittance between the peak and the bottom remains (see FIG. 14), so that the latter method excels in the ease of use.

In this case as well, from the perspective of the controllability of the wavelength, it is preferred that difference 193 of transmittance between the peak and the bottom be normally not less than 0.1 or thereabout, and that the amount of angular deviation of the incident beam from the right angle be suppressed within 5° to 6°.

In addition, when the actual assembly of the lens is effected by soldering or welding, the positional offset in the direction of the optical axis occurs within ±10 μm or thereabout. Due to this defocusing, the peak 191 of the parallel beam drops as indicated by a peak 194 during defocusing, and the bottom 192 of the parallel beam rises as indicated by a bottom 195 during defocusing. Furthermore, during the assembly of the lens, positional offsets of ±10 μm or thereabout can occur in the X and Y directions perpendicular to the optical axis, and slight variations can occur in the angle of incidence upon the etalon. For this reason, in order for the difference 193 of transmittance between the peak and the bottom to be set to not less than 0.1, it is further preferable to set the amount of angular deviation of the incident beam from the right angle within a limit 196 of angular deviation which is 4 to 5 degrees or thereabout at maximum.

Figure 15:
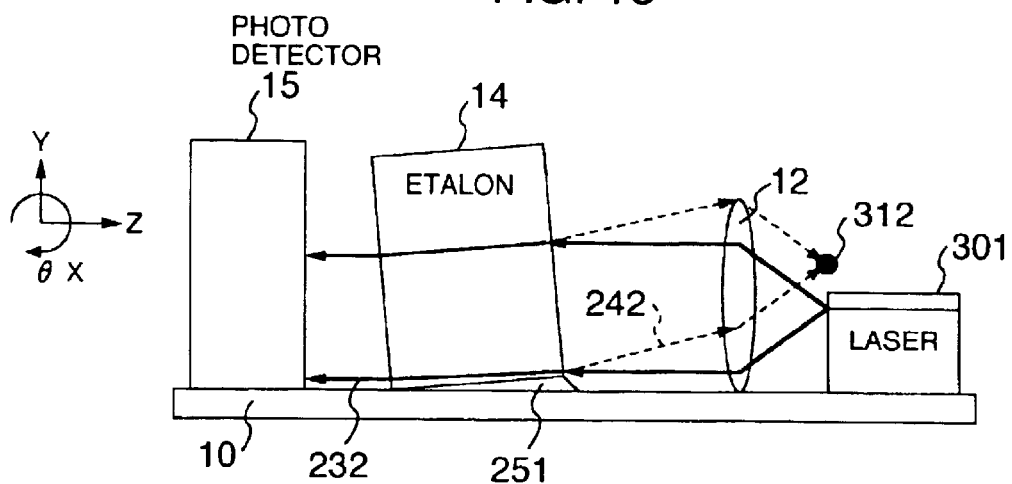
FIG. 15 is a side elevational view explaining the reflected light of the light beam from the etalon when the etalon is joined by being inclined.

Arrangements in which the angle of incidence is inclined upon the etalon are shown in FIGS. 13 and 15. FIG. 13 shows an arrangement in which the shape of the etalon is a parallelogram, and FIG. 15 shows an arrangement in which the etalon is mounted on the substrate in an inclined manner by using a joining member.

As shown in FIG. 13, if an etalon incident-plane angle 262 is inclined within the range of 1 to 5 degrees from a right angle with respect to the light beam by using the etalon 14 which has been fabricated in advance into a parallelogrammic cross section, although the transmission loss of an etalon-transmitted beam 232 becomes slightly large, an etalon-reflected beam 242 from the etalon is focused on an etalon-reflected beam position 312 above the semiconductor laser 301, so that the aforementioned problems of the return light, multiple reflection, and interference do not occur.

If an etalon 14 having a cross section of a rectangular parallelopiped is used as shown in FIG. 15, it is possible to obtain a similar effect. In this case, if the etalon and the substrate are joined by varying the thickness of the joining member 251 between the etalon and the substrate such that the etalon is distanced from an edge at a rear end face which is closest to the light-emitting center of the semiconductor laser, i.e., such that the etalon is inclined in the −θx direction within the range of 1° to 5°, the problems of the return light, multiple reflection, and interference similarly do not occur.

As described above, with the method in which the height of the lens center is set to be identical to the emitting portion of the semiconductor laser, and the lens is intentionally not shifted, but the etalon is inclined with respect to the beam, the effect of aberrations of the lens which can occur with the method in which the lens center is shifted is small. For this reason, it goes without saying that when the type of etalon is changed to one with a 100 GHz spacing and a different film reflectivity, it is possible that the maximum angle of inclination of the etalon with respect to the beam may be set to 5 degrees or more.

Next, a description will be given of the case of junction-down connection in which the active layer of a semiconductor laser 303 is located on the lower side and is close to the soldered joint surface. In this case as well, it is possible to adopt the aforementioned viewpoint of junction-up, but it is structurally preferable to cause the reflected light to be focused not on a position above the semiconductor laser but on a position therebelow.

Figure 16:
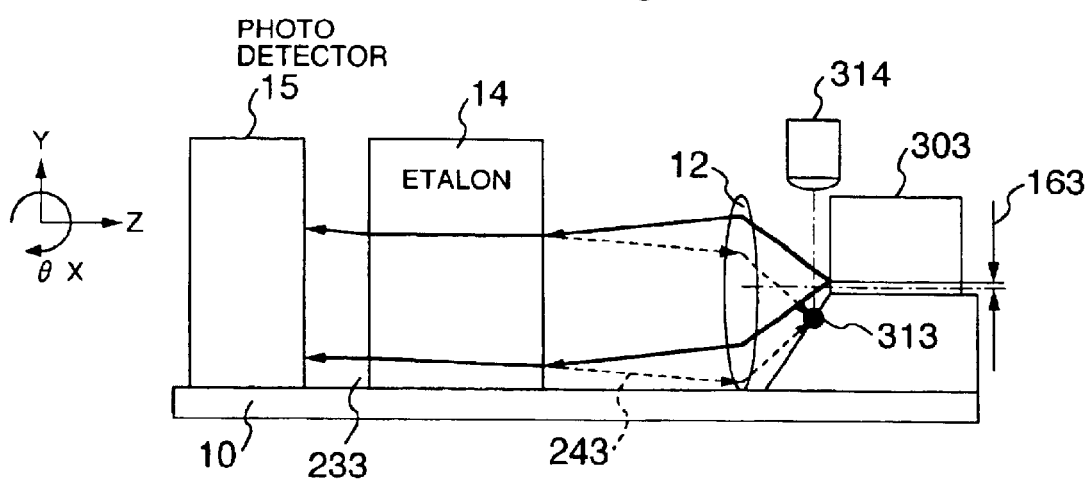
FIG. 16 is a side elevational view explaining the reflected light of the light beam from the etalon when the lens is shifted downward in accordance with the present invention.

FIG. 16 is a side elevational view illustrating the reflected light of the light beam from the etalon when the lens 12 is offset in the Y-direction (downward direction). If the height of the lens center is made lower by a lens down Y-shift 163 with respect to the height of the active layer, since the angle of incidence of the light beam with respect to the etalon 14 from the right angle becomes large, the transmission loss of an etalon-transmitted beam 233 becomes slightly large, but an etalon-reflected beam 243 from the etalon is focused on an etalon-reflected beam position 313 below the semiconductor laser 303, so that the aforementioned problems of the return light, multiple reflection, and interference do not occur. In this case, since it is possible to observe the etalon-reflected beam position 313 with an infrared detection camera 314 installed at an upper position, there is an advantage of making it possible to easily confirm the presence or absence of the effect of the return light.

Next, a description will be given of an arrangement for remedying the effect which can occur due to the fact that the light beam reflected from the etalon is reflected by the end face of the semiconductor laser, and its reflected light is led to the light-receiving element. As for this case, a case is conceivable in which the reflected light from the etalon is reflected by a surface other than the emitting portion of the semiconductor laser. For example, although the etalon angle with respect to the beam in the X-Z plane is substantially close to a right angle, the angle of the etalon at the wavelength locking point is inclined by 0.8° to 2.6° or thereabout from the right angle in the case of the etalon with the 100 GHz spacing, and 0.6° to 1.8° or thereabout in the case of the etalon with the 50 GHz spacing, as already described with reference to FIG. 6. Accordingly, a method is required for suppressing the effects of multiple reflection and interference by taking such a subtle inclination of the angle into consideration.

Figure 17:
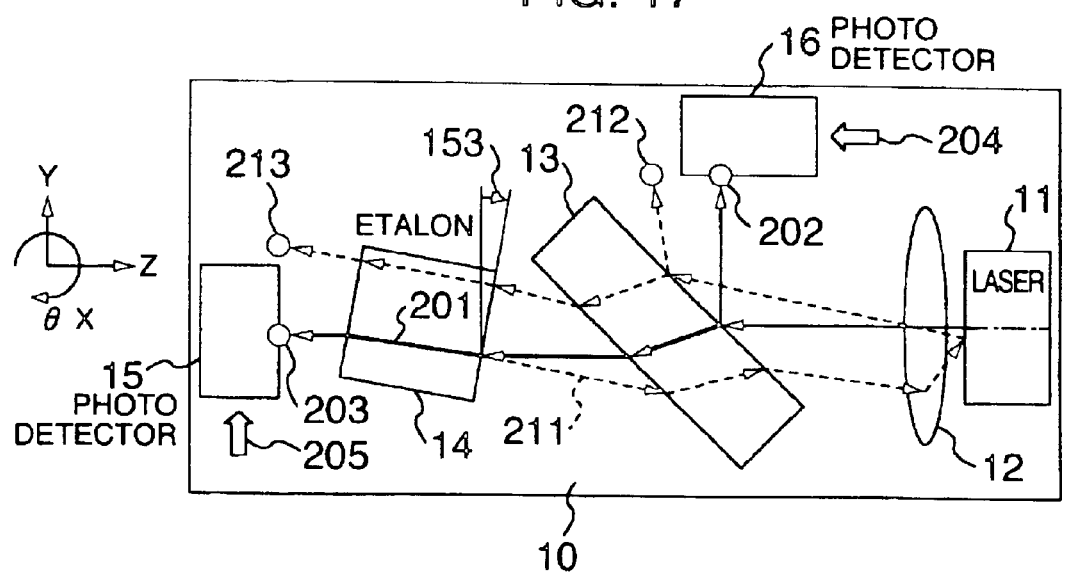
FIG. 17 is a plan view explaining a case in which the angle of incidence of the light beam upon the etalon is varied clockwise from a right angle.
Figure 18:
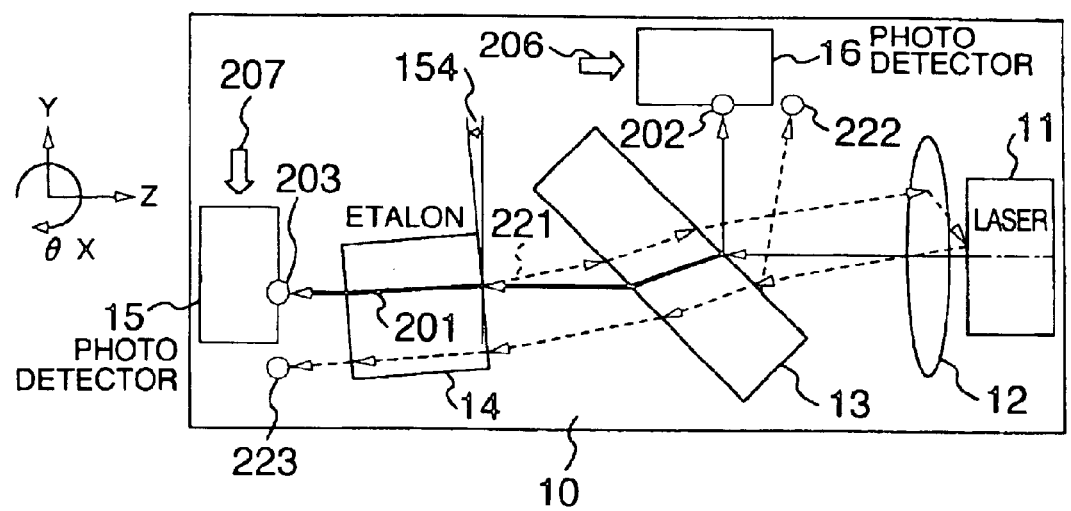
FIG. 18 is a plan view explaining a case in which the angle of incidence of the light beam upon the etalon is varied counterclockwise from a right angle.

FIG. 17 is a plan view illustrating a case in which the angle of incidence of the light beam upon the etalon is adjusted to a clockwise rotational angle 153 from the right angle. FIG. 18 is a plan view illustrating a case in which the angle of incidence of the light beam upon the etalon is adjusted to a counterclockwise rotational angle 154 from the right angle.

In FIG. 17, reflected light 211 from the etalon 14 is reflected by the end face of the semiconductor laser 11, is branched by the beam splitter 13, and one beam returns to an etalon-reflected beam position 212. The other beam is transmitted again through the etalon 14, and returns to an etalon-transmitted beam position 213. Since the intrinsic detection signal light of the quantity of laser light is at a beam-splitter-reflected beam position 202, by effecting the positional adjustment of the PD1 light-receiving element 16 in a PD1-positioning direction 204, the etalon-reflected beam position 212 is not made incident upon the center of the light-receiving portion of the PD1 light-receiving element 16, thereby making it possible to stabilize the light signal at the PD1 light-receiving element 16 for detecting the quantity of laser light. In addition, since the intrinsic wavelength-locked detection signal light is at an etalon-transmitted beam position 203, by effecting the positional adjustment of the PD2 light-receiving element 15 in a PD2-positioning direction 205, the etalon-transmitted beam position 213 is not made incident upon the center of the light-receiving portion of the PD2 light-receiving element 15, thereby making it possible to stabilize the light signal at the PD2 light-receiving element 15 for receiving the light for wavelength locking. Here, a situation in which the effects of multiple reflection and interference cannot be completely eliminated can occur depending on the relative magnitudes of the distance between the beam-splitter-reflected beam position 202 and the etalon-reflected beam position 212, the beam diameter, and the diameter of the PD1 light-receiving element 16.

Accordingly, in FIG. 17, the effects of multiple reflection and interference are suppressed by disposing the position of the PD1 light-receiving element 16 in an offset manner such that the beam-splitter-reflected beam position 202 is located in the vicinity of the center of the PD1 light-receiving element 16, and the etalon-reflected beam position 212 is located on an outer peripheral portion of the PD1 light-receiving portion 16. Naturally, the effects of multiple reflection and interference may be suppressed by offsetting the position of the PD2 light-receiving element 15 in a similar method.

Likewise in FIG. 18, reflected light 221 from the etalon 14 is reflected by the end face of the semiconductor laser 11, is branched by the beam splitter 13, and one beam returns to an etalon-reflected beam position 222. The other beam is transmitted again through the etalon 14, and returns to an etalon-transmitted beam position 223. Since the intrinsic detection signal light of the quantity of laser light is at a beam-splitter-reflected beam position 202, by effecting the positional adjustment of the PD1 light-receiving element 16 in a PD1-positioning direction 206, the etalon-reflected beam position 222 is not made incident upon the center of the light-receiving portion of the PD1 light-receiving element 16, thereby making it possible to stabilize the light signal at the PD1 light-receiving element 16 for detecting the quantity of laser light. In addition, since the intrinsic wavelength-locked detection signal light is at an etalon-transmitted beam position 203, by effecting the positional adjustment of the PD2 light-receiving element 15 in a PD2-positioning direction 207, the etalon-transmitted beam position 223 is not made incident upon the center of the light-receiving portion of the PD2 light-receiving element 15, thereby making it possible to stabilize the light signal at the PD2 light-receiving element 15 for receiving the light for wavelength locking.

As described above, since the angle of the incident plane of the etalon with respect to the incident beam is set within 3° at maximum from a right angle in the X-Z plane, and the position of the light-receiving element is disposed by being positionally offset in a specific direction in correspondence with the direction of its angular deviation from the right angle, it becomes possible to suppress multiple reflection and interference between the etalon and the end face of the laser, and stabilize the quantity of laser light and the wavelength detection signal.

As for the method of adjusting the light beam within the Y-Z plane and the method of adjusting the light beam within the X-Z plane, it is possible to adopt either one of the two methods. Furthermore, if the two methods are adopted concurrently, it is possible to further suppress the multiple reflection and interference, and further stabilize the quantity of laser light and the wavelength detection signal.

By thus adopting the method in which the laser light is converted into a parallel beam by the lens and is made incident upon the etalon substantially at a right angle to detect and stabilize the wavelength, an advantage is offered in that the wavelength can be detected with respect to a plurality of different wavelengths by making use of the multiple wavelength selectivity of the etalon. Thus, it becomes possible to make the wavelength selective parts common and realize low cost in the manufacture. Further, the reflected light from the etalon does not return to the emitting portion of the semiconductor laser, and the multiple reflection and interference between the etalon and the rear end face of the laser due to the fact that the reflected light from the etalon returns to the emitting portion of the semiconductor laser and is reflected do not occur, so that the wavelength detection signal is stabilized. For this reason, there is an advantage in that high yield in the manufacture can be attained. As described above, it becomes possible to provide a high-function, high-reliability optical module and a method of manufacturing the same.

In accordance with one measure of the invention, it is possible to provide an optical module which, in the method of detecting a plurality of different wavelengths by making use of the multiple wavelength selectivity of the etalon, prevents the reflected light from the etalon from returning to the emitting portion of the semiconductor laser and prevents the occurrence of multiple reflection and interference between the etalon and the rear end face of the laser as the reflected light from the etalon returns to the rear end face of the laser.

What is claimed is:

1. An optical module comprising:
    a semiconductor laser;
    a lens for converting a beam emitted from said semiconductor laser into a substantially parallel beam;
    a beam splitter for splitting the converted beam into a reflected beam and a transmitted beam;
    a first light-receiving element disposed such that one of the split beams is incident thereupon through an etalon; and
    a second light-receiving element disposed such that another one of the beams is incident thereupon,
    wherein a center of the lens is offset from a center of the beam emitted from the semiconductor laser so that a center of a reflected beam from said etalon occurring due to incidence of the split beam upon said etalon is arranged to return to a region other than a beam-emitting portion of said semiconductor laser.

2. An optical module comprising:
    a semiconductor laser;
    a lens for converting a beam emitted from said semiconductor laser into a substantially parallel beam;
    a beam splitter for splitting the converted beam into a reflected beam and a transmitted beam;
    a light-receiving element disposed such that all or a portion of the beam is incident upon the light-receiving element through an etalon,
    wherein a center of the lens is offset from a center of the beam emitted from the semiconductor laser so that a center of a reflected beam from said etalon occurring due to incidence of the split beam upon said etalon returns to a region other than a beam-emitting portion of said semiconductor laser.

3. The optical module according to claim 2, wherein the center of the reflected beam from said etalon is arranged to return to a region other than an end face including the emitting portion of said semiconductor laser.

4. The optical module according to claim 2, wherein, in junction-up connection in which the emitting portion of said semiconductor laser is mounted remote from a substrate, said lens is mounted offset in a direction away from said substrate on which said semiconductor laser is mounted.

5. The optical module according to claim 3, wherein, in junction-up connection in which the emitting portion of said semiconductor laser is mounted remote from a substrate, said lens is mounted offset in a direction away from said substrate on which said semiconductor laser is mounted.

6. The optical module according to claim 2, wherein, in junction-down connection in which the emitting portion of said semiconductor laser is mounted close to a substrate, said lens is mounted offset in a direction of approaching said substrate on which said semiconductor laser is mounted.

7. The optical module according to claim 3, wherein, in junction-down connection in which the emitting portion of said semiconductor laser is mounted close to a substrate, said lens is mounted offset in a direction of approaching said substrate on which said semiconductor laser is mounted.

8. The optical module according to according to claim 4, wherein an amount of offset of said lens is greater than one half of a total of a radius of a beam waist of the reflected beam from said etalon and a height of the laser emitting portion from said substrate.

9. The optical module according to according to claim 4, wherein an amount of offset of said lens is smaller than a quantity of tan 4° of the focal length of said lens.

10. The optical module according to according to claim 3, wherein a beam incident plane of said etalon is inclined with respect to the transmitted beam which is transmitted therethrough.

11. The optical module according to according to claim 10, wherein the beam incident plane of said etalon is inclined in a range of 1 to 5 degrees.

12. The optical module according to according to claim 10, wherein a side elevational shape of said etalon is a parallelogram.

13. The optical module according to according to claim 10, wherein said inclination is formed by changing the thickness of a joining member for joining said etalon and said substrate for mounting said etalon.

14. An optical module in which a beam emitted from a semiconductor laser is converted into a substantially parallel beam by a lens, and is subsequently split by a beam splitter into a reflected beam and a transmitted beam, one of the beams is incident upon a light-receiving element, and another one of the beams is incident upon another light-receiving element through an etalon, wherein a reflected beam which returns to and reflected by said semiconductor laser is split again into a reflected beam and a transmitted beam said beam splitter, and each of said light-receiving elements is disposed such that a center of each of the beams is not incident upon a center of a light-receiving portion of each of said light-receiving elements.

15. The optical module according to according to claim 14, wherein a component arranged on an optical path between said etalon and said semiconductor laser is disposed such that the reflected beam reflected by said etalon returns to and is reflected by said semiconductor laser.

16. The optical module according to according to claim 14, wherein the beam is not split by said beam splitter, and all or a portion of the beam is incident upon said light-receiving element through said etalon.

17. The optical module according to according to claim 14, wherein an angle of the incident beam with respect to a centering rotating direction of said etalon is set within 3 degrees at maximum from a right angle.

18. The optical module according to according to claim 16, wherein an angle of the incident beam with respect to a centering rotating direction of said etalon is set within 3 degrees at maximum from a right angle.

19. An optical module comprising:

an etalon which has a side elevational shape of a parallelogram and whose light incident plane and emergent plane are inclined within a range of 1 to 5 degrees from a right angle with respect to a substrate on which said etalon is mounted, and which etalon is positioned to receive a laser beam that has passed through a portion of a lens offset from a center of the lens.

20. The optical module according to claim 2, wherein a member having a reflection coefficient lower than that of a cleavage plane of said semiconductor laser is provided at a position to which the center of the reflected beam from said etalon returns.

* * * * *